US012568839B2

(12) United States Patent
Lee et al.

(10) Patent No.: US 12,568,839 B2
(45) Date of Patent: Mar. 3, 2026

(54) SEMICONDUCTOR PACKAGE AND METHOD OF FABRICATING THE SAME

(71) Applicant: SAMSUNG ELECTRONICS CO., LTD., Suwon-si (KR)

(72) Inventors: Gun Lee, Suwon-si (KR); Jun Woo Myung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 376 days.

(21) Appl. No.: 18/309,070

(22) Filed: Apr. 28, 2023

(65) Prior Publication Data

US 2024/0047327 A1    Feb. 8, 2024

(30) Foreign Application Priority Data

Aug. 2, 2022    (KR) ......................... 10-2022-0095816

(51) Int. Cl.
*H01L 23/498* (2006.01)
*H01L 23/00* (2006.01)
*H01L 23/31* (2006.01)

(52) U.S. Cl.
CPC .... *H01L 23/49822* (2013.01); *H01L 23/3107* (2013.01); *H01L 24/20* (2013.01); *H01L 24/19* (2013.01); *H01L 2224/19* (2013.01); *H01L 2224/221* (2013.01)

(58) Field of Classification Search
CPC ........... H01L 23/19822; H01L 23/3107; H01L 24/20; H01L 24/19; H01L 2224/19; H01L 2224/221
See application file for complete search history.

(56) References Cited

U.S. PATENT DOCUMENTS

| | | | |
|---|---|---|---|
| 10,026,681 B2 | 7/2018 | Ko et al. | |
| 10,522,451 B2 | 12/2019 | Kim et al. | |
| 10,541,201 B2 | 1/2020 | Lee et al. | |
| 10,566,289 B2 | 2/2020 | Lee et al. | |
| 2005/0110147 A1* | 5/2005 | Wu ................... | H01L 23/53238 |
| | | | 257/758 |
| 2019/0198429 A1* | 6/2019 | Kang ...................... | H01L 23/34 |

(Continued)

FOREIGN PATENT DOCUMENTS

KR    10-2018-0032148    3/2018

*Primary Examiner* — Timor Karimy
(74) *Attorney, Agent, or Firm* — MORGAN, LEWIS & BOCKIUS LLP

(57) ABSTRACT

Provided is a semiconductor package. The semiconductor package may include a first redistribution structure, a first semiconductor chip including a first surface and a second surface, the first surface being disposed to face the first redistribution structure, a second redistribution structure disposed on the second surface of the first semiconductor chip and including a second insulating layer and a second redistribution layer, a first sealing layer disposed between the first and second redistribution structures and configured to cover the second surface of the first semiconductor chip, and a connection structure configured to connect the first and the second redistribution structures, wherein the second redistribution layer includes a first via and a second via on the first via, wherein the first via includes first and second seed layers, and a conductive layer on the second seed layer, and wherein the first sealing layer includes a photosensitive insulating material.

19 Claims, 18 Drawing Sheets

(56)            References Cited

U.S. PATENT DOCUMENTS

| 2021/0143118 | A1* | 5/2021 | Joo | ..................... H01L 24/13 |
| 2021/0384136 | A1 | 12/2021 | Lee et al. | |
| 2021/0384153 | A1 | 12/2021 | Lee et al. | |
| 2022/0102309 | A1 | 3/2022 | Lee et al. | |

* cited by examiner

SEMICONDUCTOR PACKAGE AND METHOD OF FABRICATING THE SAME

CROSS-REFERENCE TO RELATED APPLICATION

This application claims priority from Korean Patent Application No. 10-2022-0095816 filed on Aug. 2, 2022 in the Korean Intellectual Property Office, and all the benefits accruing therefrom under 35 U.S.C. 119, the contents of which in its entirety are herein incorporated by reference.

BACKGROUND

1. Technical Field

The present disclosure relates to a semiconductor package and a method of fabricating the same.

2. Description of the Related Art

Semiconductor packages have been developed in a direction that can provide multi-functionality, high capacity, and miniaturization. To this end, several semiconductor chips are integrated into one semiconductor package, thereby achieving high-capacity and multifunctional semiconductor packages, while reducing the size of the semiconductor packages.

One type of package technology proposed to satisfy the technical demand is a fan-out semiconductor package. Such a fan-out package can have a compact size and may allow a plurality of pins to be implemented by redistributing electrical connection structures outwardly of a region in which a semiconductor chip is disposed.

SUMMARY

Aspects of the present disclosure provide a semiconductor package capable of reducing the size of components and implementing a micropattern.

Aspects of the present disclosure also provide a method of fabricating a semiconductor package capable of reducing the size of components and implementing a micropattern.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an aspect of the present disclosure, there is provided a semiconductor package including a first redistribution structure; a first semiconductor chip including a first surface and a second surface, the first surface being disposed to face the first redistribution structure, a second redistribution structure disposed on the second surface of the first semiconductor chip and including a second insulating layer and a second redistribution layer, a first sealing layer disposed between the first and the second redistribution structures and configured to cover the second surface of the first semiconductor chip, and a connection structure configured to connect the first and the second redistribution structures, wherein the second redistribution layer includes a first via in contact with the first sealing layer and a second via on the first via and in contact with the second insulating layer, wherein the first via includes a first seed layer and a second seed layer, and a conductive layer on the second seed layer and in the first via hole, and wherein the first sealing layer includes a photosensitive insulating material integrally covering the second surface of the first semiconductor chip and a sidewall of the first seed layer.

According to another aspect of the present disclosure, there is provided a semiconductor package including a first redistribution structure, a first semiconductor chip including a first surface and a second surface and electrically connected to the first redistribution structure through a coupling pad formed on the first surface, a second redistribution structure disposed on the second surface of the first semiconductor chip and including a second insulating layer and a second redistribution layer, a connection structure configured to electrically connect the first and second redistribution structures, and a photosensitive insulating layer disposed between the first and second redistribution structures that covers the second surface of the first semiconductor chip, wherein the second redistribution layer includes a first via hole passing through at least a portion of the photosensitive insulating layer and a second via hole passing through at least a portion of the second insulating layer, wherein the second redistribution layer further includes a first via filling the first via hole, wherein the first via includes a first seed layer and a second seed layer along a sidewall and a bottom surface of the first via hole and a conductive layer on the second seed layer to fill the first via hole, and wherein the photosensitive insulating layer integrally covers the second surface of the first semiconductor chip and a sidewall of the first seed layer.

According to yet another aspect of the present disclosure, there is provided a semiconductor package including a first redistribution structure including a first insulating layer and a first redistribution layer, a first semiconductor chip including a first surface and a second surface and electrically connected to the first redistribution structure through a coupling pad formed on the first surface, a second redistribution structure disposed on the second surface of the first semiconductor chip and including a second insulating layer and a second redistribution layer, a connection structure configured to electrically connect the first and second redistribution structures, and at least one layer of a photosensitive insulating layer disposed between the first and second redistribution structures to cover the second surface of the first semiconductor chip and including no filler, wherein the second redistribution layer includes a first via that fills a first via hole passing through at least a portion of the photosensitive insulating layer and a second via that fills a second via hole passing through at least a portion of the second insulating layer, the first via includes a titanium seed layer and a copper seed layer, which are sequentially stacked along a sidewall and a bottom surface of the first via hole, and a conductive layer formed on the copper seed layer to fill the first via hole, and surface roughness of the sidewall of the first via hole is less than surface roughness of a sidewall of the second via hole.

According to still another aspect of the present disclosure, there is provided a method of fabricating a semiconductor package including forming a sealing layer on a first surface of a connection structure including a plurality of insulating layers and a plurality of connection pads and a first surface of a first semiconductor chip, forming a first via hole that exposes each of the plurality of connection pads by removing at least a portion of the sealing layer, forming a seed layer along a sidewall and a bottom surface of the first via hole and an upper surface of the sealing layer, attaching a first carrier substrate onto the seed layer, forming a first redistribution structure on a second surface of the semiconductor chip and a second surface of the connection structure, and forming a second redistribution structure by removing the first carrier substrate and forming a conductive layer on the seed layer.

It should be noted that the effects of the present disclosure are not limited to those described above, and other effects of the present disclosure will be apparent from the following description.

BRIEF DESCRIPTION OF THE DRAWINGS

The above and other aspects and features of the present disclosure will become more apparent by describing in detail embodiments thereof with reference to the attached drawings, in which:

FIGS. 9 to 18 are views illustrating intermediate stages of fabrication, provided to explain a method of fabricating a semiconductor package, according to embodiments of the present disclosure.

DETAILED DESCRIPTION OF THE EMBODIMENTS

Hereinafter, an electronic device 1 including a semiconductor package 1000 will be described with reference to FIGS. 1 to 6.

Figure 1:
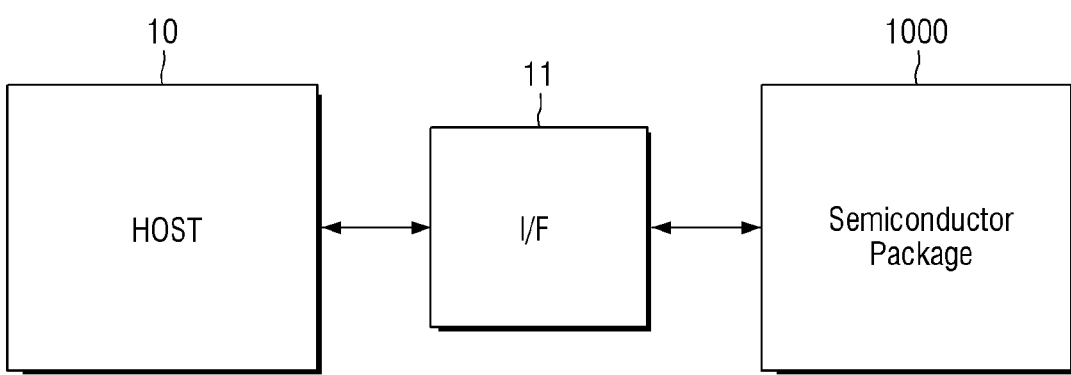
FIGS. 1 and 2 are diagrams for explaining an electronic device, according to embodiments of the present disclosure.
Figure 2:
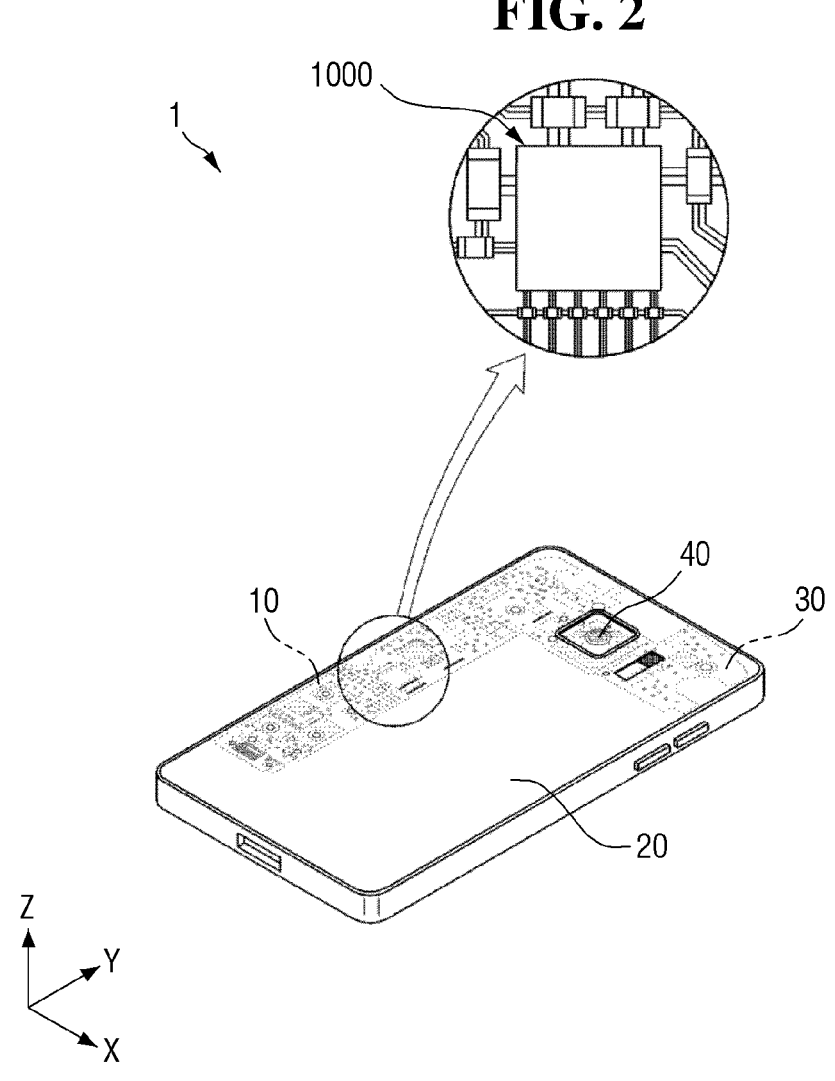
Figure 3:
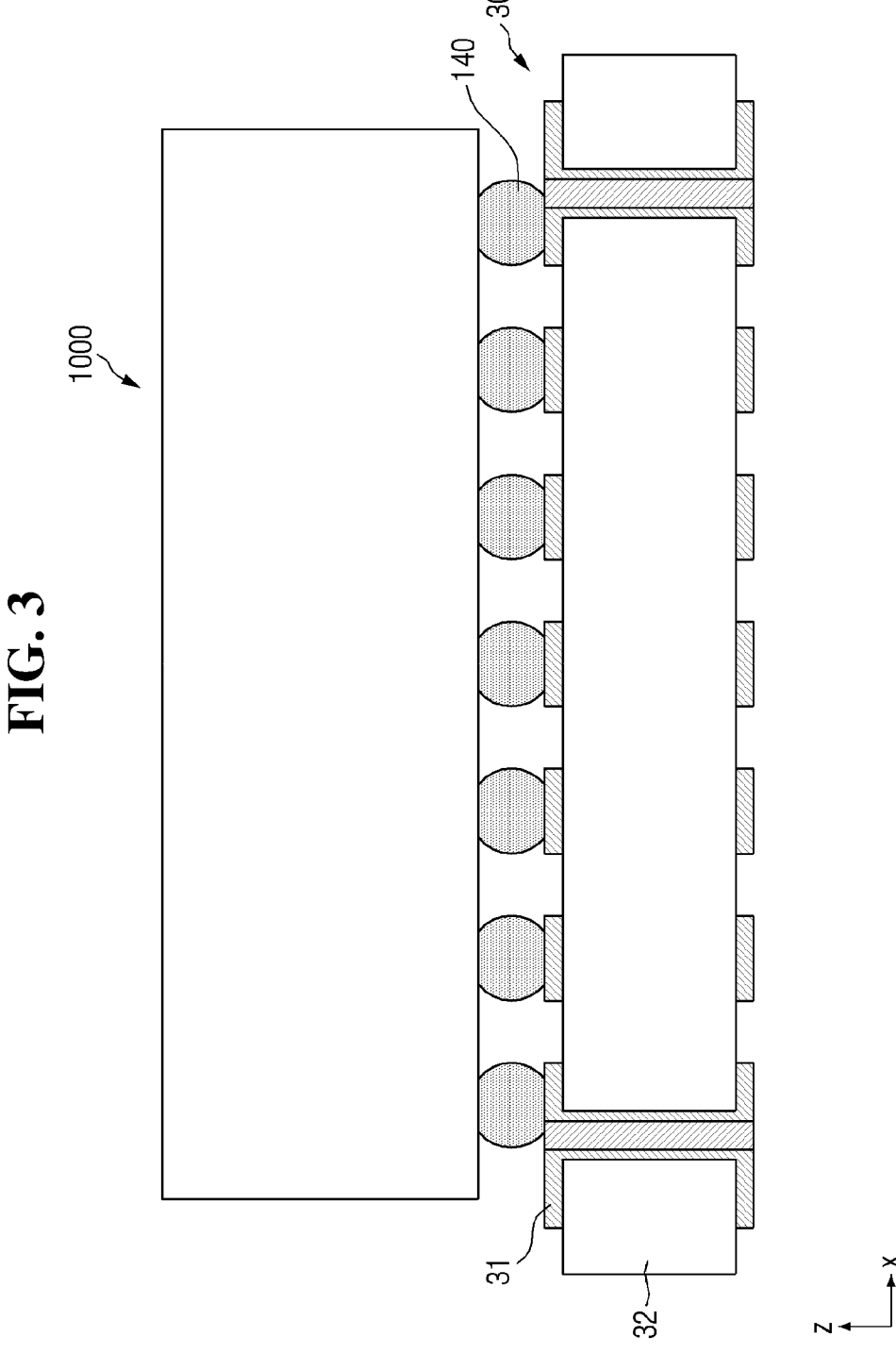
FIG. 3 is a view of a semiconductor package and a main board of FIG. 2, according to embodiments of the present disclosure.
Figure 4:
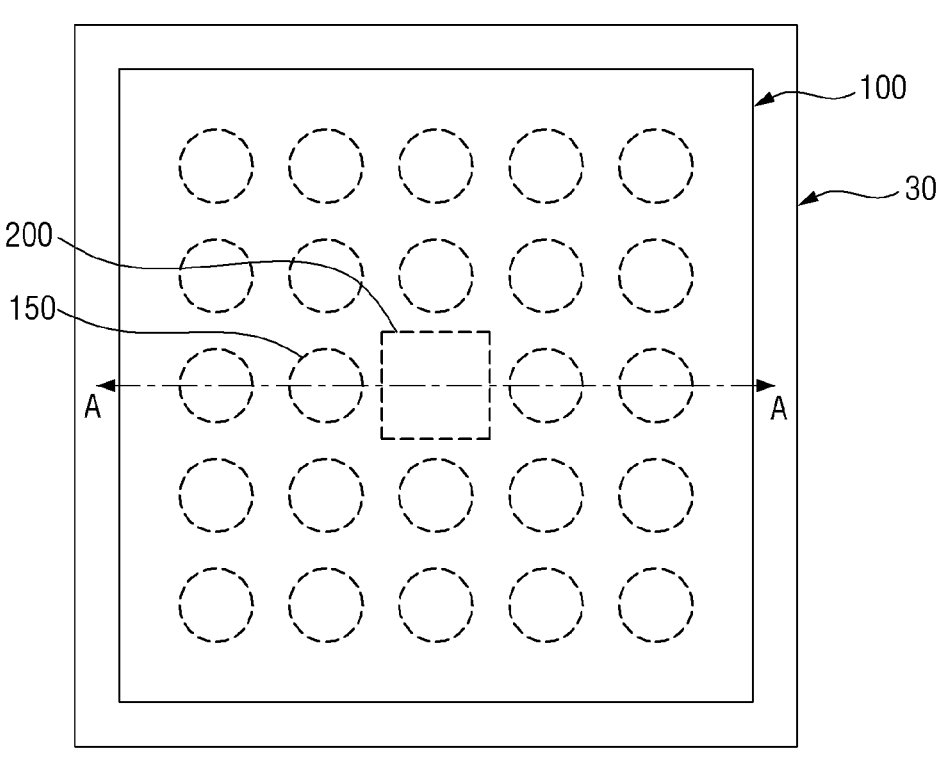
FIG. 4 is a top view of the semiconductor package of FIG. 3, according to embodiments of the present disclosure.
Figure 4:
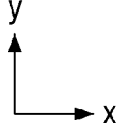

FIGS. 1 and 2 are diagrams for explaining an electronic device according to various embodiments of the present disclosure. FIG. 3 is a side view of a semiconductor package and a main board of FIG. 2. FIG. 4 is a top view of the semiconductor package of FIG. 3.

Referring to FIG. 1, the electronic device 1 may include a host 10, an interface (UF) 11, and a semiconductor package 1000.

In some embodiments, the host 10 may be connected to the semiconductor package 1000 through the interface 11. For example, the host 10 may transmit a signal to the semiconductor package 1000 to control the semiconductor package 1000. Furthermore, for example, the host 10 may receive a signal from the semiconductor package 1000 and process data included in the signal.

For example, the host 10 may include a central processing unit (CPU), a controller, an application specific integrated circuit (ASIC), and the like. In addition, for example, the host may include a memory chip such as a dynamic random access memory (DRAM), a static RAM (SRAM), a phase-change RAM (PRAM), a magneto resistive RAM (MRAM), a Ferroelectric RAM (FeRAM), and a resistive RAM (RRAM).

Referring to FIGS. 1 and 2, the electronic device 1 may include a host 10, a body 20, a main board 30, a camera module 40, and a semiconductor package 1000.

The main board 30 may be mounted in the body 20 of the electronic device 1. The host 10, the camera module 40, and the semiconductor package 1000 may be mounted on the main board 30. The host 10, the camera module 40, and the semiconductor package 1000 may be electrically connected to each other by the main board 30. For example, the interface 11 may be implemented by the main board 30.

In various embodiments, the host 10 and the semiconductor package 1000 may be electrically connected to each other by the main board 30 to transmit and receive signals.

Referring to FIG. 3, the semiconductor package 1000 may be disposed on the main board 30. For example, a connection terminal 140 of the semiconductor package 1000 may be disposed on the main board 30. For example, the main board 30 may be connected to the semiconductor package 1000 by the connection terminal(s) 140 of the semiconductor package 1000.

The main board 30 may be a printed circuit board (PCB), a ceramic substrate, a glass substrate, an interposer substrate, or the like. However, the various embodiments, according to the technical idea of the present disclosure, are not limited thereto, and for convenience of description, the following description assumes that the main board 30 is a PCB.

The main board 30 may include a wiring structure 31 and a core 32. The core 32 may include a copper clad laminate (CCL), prepreg (PPG), Ajinomoto Build-up Film (ABF), epoxy, polyimide, and the like. The wiring structure 31 may include, but is not limited to, at least one of copper (Cu), aluminum (Al), silver (Ag), tin (Sn), gold (Au), nickel (Ni), lead (Pb), titanium (Ti), or alloys thereof.

The core 32 may be disposed at a central part of the main board 30, and the wiring structure 31 may be disposed above and below the core 32. The wiring structure 31 may be disposed above and below the main board 30 to be exposed.

Further, the wiring structure 31 may be disposed to penetrate the core 32. The wiring structure 31 may electrically connect elements which come into contact with the main board 30. For example, the wiring structure 31 may electrically connect the semiconductor package 1000 to the host 10. For example, the wiring structure 31 may electrically connect the semiconductor package 1000 to the host 10 through the connection terminal(s) 140. The connection terminal(s) 140 can physically and electrically connect to the semiconductor package 1000.

FIG. 4 is a top view of the semiconductor package of FIG. 3, according to embodiments of the present disclosure. The semiconductor package 1000 may include a first redistribution structure 100, a first semiconductor chip 200, and a connection structure 150.

Figure 5:
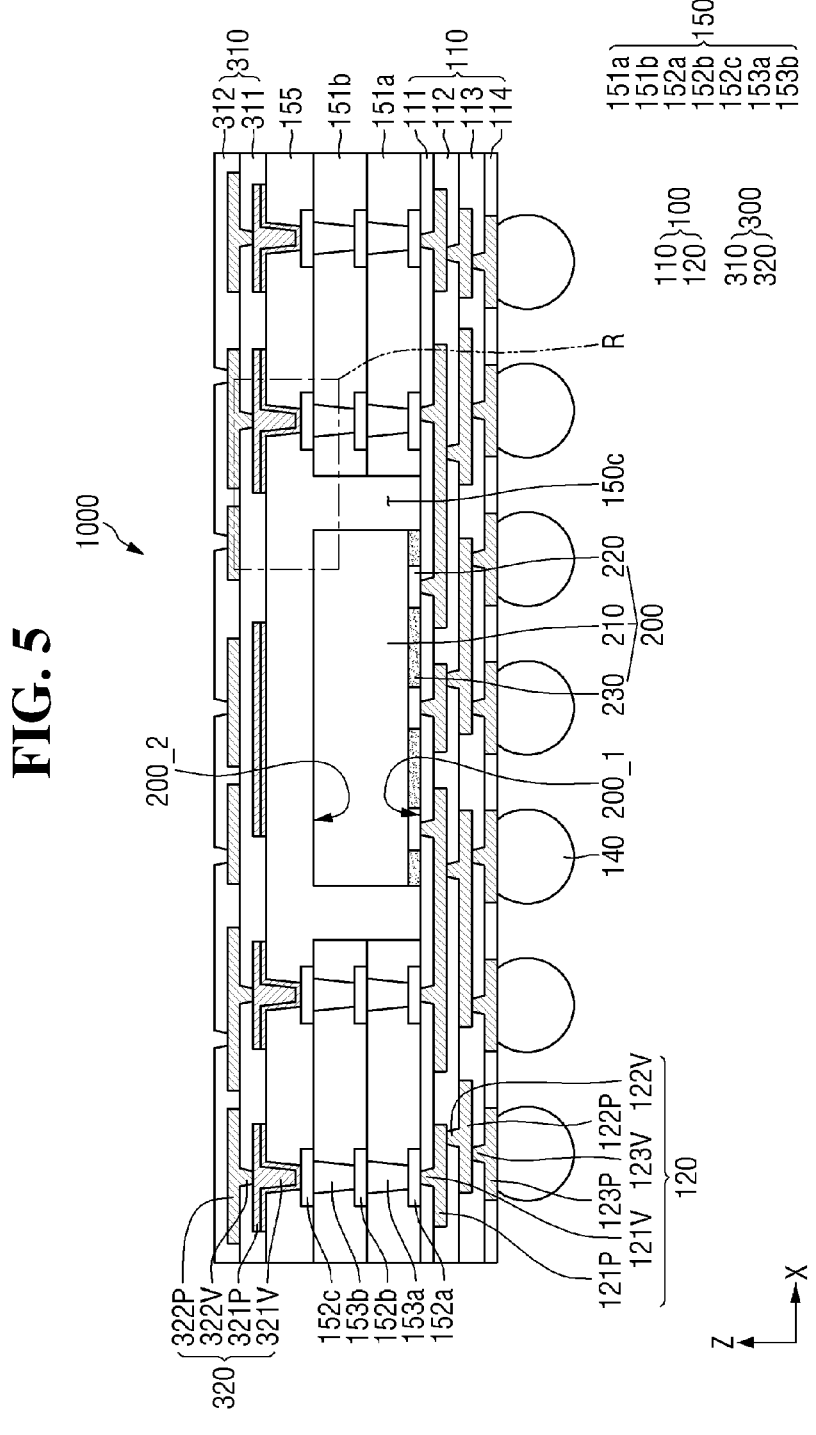
FIG. 5 is a cross-sectional side view for explaining the semiconductor package taken along line V-V' of FIG. 4, according to embodiments of the present disclosure.

FIG. 5 is a cross-sectional view for explaining the semiconductor package taken along line V-V' of FIG. 4.

Figure 6:
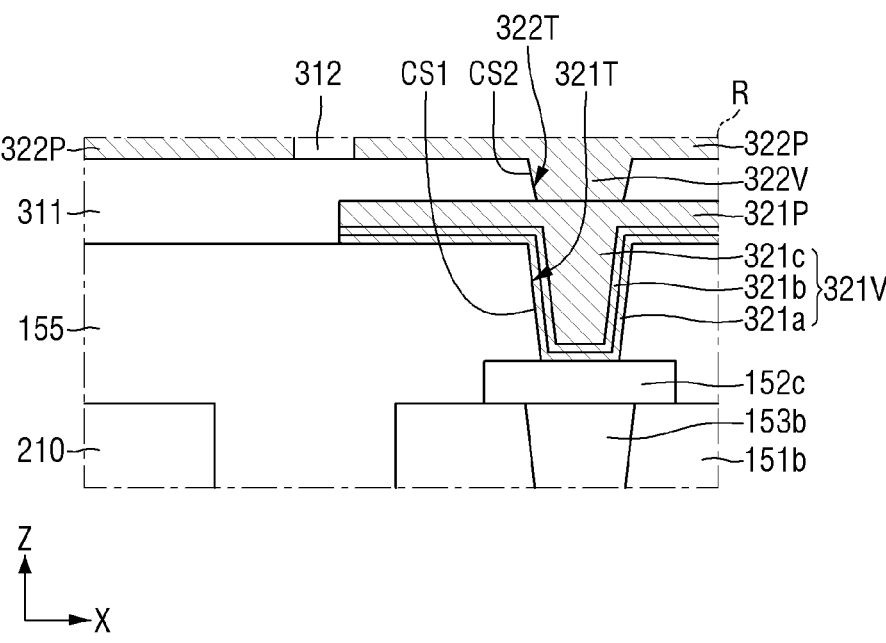
FIG. 6 is an enlarged view of region R of FIG. 5, according to embodiments of the present disclosure.

FIG. 6 is an enlarged view of region R of FIG. 5.

Referring to FIGS. 5 and 6, the semiconductor package 1000 may include a first redistribution structure 100, a first semiconductor chip 200, a connection structure 150, a first sealing layer 155, and a second redistribution structure 300.

The first redistribution structure 100 may be a front redistribution layer (FRDL). The first redistribution structure 100 may redistribute a coupling pad 220 of the first semiconductor chip 200, where a plurality of coupling pads 220 of the first semiconductor chip 200 may be redistributed through the first redistribution structure 100. For example, the plurality of coupling pads 220 may be physically or electrically connected to the first connection terminals 140 through the first redistribution structure 100.

The first redistribution structure 100 may be in physical and electrical contact with the first semiconductor chip 200 and a portion of the first sealing layer 155. For example, an upper surface of the first redistribution structure 100 that faces both the first semiconductor chip 200 and the first sealing layer 155 may be in contact with the first semiconductor chip 200 and a portion of the first sealing layer 155.

The first redistribution structure 100 may include an insulating layer 110 and a redistribution layer 120. The insulating layer 110 may include first to fourth insulating layers 111, 112, 113, and 114, although greater or fewer layers are also contemplated within the scope of the embodiments. In various embodiments, the redistribution layer 120 may include first to third redistribution pads 121P, 122P, and 123P and first to third redistribution vias 121V, 122V, and 123V.

The first insulating layer 111 may be formed on a lower surface of the first sealing layer 155. The first redistribution via 121V may penetrate through the first insulating layer 111 and be physically and electrically connected to the first redistribution pad 121P. The first redistribution pad 121P may be connected to the first redistribution via 121V and be formed below the first insulating layer 111. The first redistribution via 121V may connect a first connection pad 152a of the connection structure 150 to the first redistribution pad 121P. The first redistribution via 121V may electrically connect the coupling pad 220 of the first semiconductor chip 200 to the first redistribution pad 121P.

The second insulating layer 112 may be formed to cover the first insulating layer 111 and the first redistribution pad 121P. The second redistribution via 122V may penetrate through the second insulating layer 122 and be physically and electrically connected to the second redistribution pad 122P. The second redistribution pad 122P may be connected to the second redistribution via 122V and be formed below the second insulating layer 112. The second redistribution via 122V may electrically connect the first redistribution pad 121P to the second redistribution pad 122P.

The third insulating layer 113 may be formed to cover the second insulating layer 112 and the second redistribution pad 122P. The third redistribution via 123V may penetrate through the third insulating layer 123 and be physically and electrically connected to the third redistribution pad 123P. The third redistribution pad 123P may be connected to the third redistribution via 123V and be formed below the third insulating layer 113. The third redistribution via 123V may electrically connect the second redistribution pad 122P to the third redistribution pad 123P.

The fourth insulating layer 114 may be formed to cover the third insulating layer 113 and the third redistribution pad 123P. The fourth insulating layer 114 may protect the first redistribution structure 100 from the outside. The fourth insulating layer 114 may include an opening that exposes a portion of the third redistribution pad 123P of the first redistribution structure 100. The opening may expose a portion of one surface of the third redistribution pad 123P.

The first to fourth insulating layers 111, 112, 113, and 114 may include an insulating material. For example, the first to fourth insulating layers 111, 112, 113, and 114 may include a photosensitive insulating material, such as photoimageable dielectric (PID) resin, in addition to a thermosetting resin, such as an epoxy resin and a thermoplastic resin, such as a polyimide resin. When a photosensitive insulating material is used for the first to fourth insulating layers 111, 112, 113, and 114, the first to fourth insulating layers 111, 112, 113 and 114 may be formed thinner.

The first to third redistribution vias 121V, 122V, and 123V electrically connect the first to third redistribution pads 121P, 122P, and 123P, the coupling pads 220, and the first connection pad 152a that are formed on different layers to each other. Accordingly, an electrical path may be formed in the semiconductor package 1000.

The first to third redistribution vias 121V, 122V, and 123V may include a conductive material, such as copper (Cu), aluminum (Al), silver (Ag), tin (Sn), gold (Au), nickel (Ni), lead (Pb), titanium (Ti), or alloys thereof. The first to third redistribution vias 121V, 122V, and 123V may be entirely filled with a conductive material. Alternatively, the conductive material may be formed along walls of the first to third redistribution vias 121V, 122V, and 123V. The first to third redistribution vias 121V, 122V, and 123V may include the various shapes known in the art, such as a tapered shape, a cylindrical shape, or the like.

The first to third redistribution pads 121P, 122P, and 123P may redistribute the coupling pads 220. The first to third redistribution pads 121P, 122P, and 123P may include a conductive material, such as copper (Cu), aluminum (Al), silver (Ag), tin (Sn), gold (Au), nickel (Ni), lead (Pb), titanium (Ti), or alloys thereof. The first to third redistribution pads 121P, 122P, and 123P may each perform various functions depending on designs of corresponding layers. For example, the first to third redistribution pads 121P, 122P, and 123P may include ground (GND) patterns, power (PWR) patterns, signal (S) patterns, and the like.

The fourth insulating layer 114 may include an insulating material. For example, the fourth insulating layer 114 may include a photosensitive insulating material, such as a photosensitive insulating resin. In addition, the fourth insulating layer 114 may include a solder resist.

In the drawings, the number of layers of the redistribution pad and the number of layers of the insulating layer of the first redistribution structure 100 are 3 and 4, respectively, but the present disclosure is not limited thereto.

The connection terminal 140 may physically and electrically connect the semiconductor package 1000 to the outside. For example, the semiconductor package 1000 may be mounted on the main board 30 of the electronic device 1 through the connection terminal 140.

The connection terminal 140 may include a conductive material. For example, the connection terminal 140 may include a solder, or the like. The connection terminal 140 may include a land, a ball, a pin, or the like. The number of connection terminals 140 may vary depending on the number of coupling pads 220 of the first semiconductor chip 200.

At least one of a plurality of connection terminals 140 may be disposed in a fan-out region. The fan-out region refers to a region beyond the region in which the first semiconductor chip 200 is disposed. Accordingly, the semiconductor package 1000 may be a fan-out semiconductor package. The fan-out semiconductor package may be more reliable than a fan-in semiconductor package, may be able to implement a large number of input/output terminals, and may facilitate a 3D interconnection. In addition, the fan-out semiconductor package may be mounted on electronic devices without a separate substrate as compared to a ball grid array (BGA) package, a land grid array (LGA) package, or the like, and may be fabricated to be thinner and competitive price.

The first semiconductor chip 200 may be disposed on the first redistribution structure 100. For example, the first semiconductor chip 200 may be disposed on the central part of the first redistribution structure 100. The first semiconductor chip 200 may be electrically connected to the first redistribution structure 100.

The first semiconductor chip 200 may include a logic circuit. For example, the first semiconductor chip 200 may include an integrated circuit (IC). For example, the first semiconductor chip 200 may include, but is not limited to, an application processor chip such as a central processor (e.g., a CPU), a graphic processor (e.g., a GPU), a digital signal processor (DSP), an encryption processor, a microprocessor, or a microcontroller.

The first semiconductor chip 200 may include a body 210, a coupling pad 220, and a passivation film 230. The body 210 may include silicon (Si), germanium (Ge), gallium arsenide (GaAs), or the like, and the body 210 may include various circuits. The coupling pad 220 may connect the first semiconductor chip 200 to another configuration (e.g., the first redistribution structure 100). The coupling pad 220 may include a conductive material. The passivation film 230 may expose the coupling pad 220 on the body 210. The passivation film 230 may be an oxide film, a nitride film, or a bilayer of an oxide film and a nitride film. However, the present disclosure is not limited thereto.

A through hole-shaped cavity 150c may be formed between the first semiconductor chip 200 and the connection structure 150. The first semiconductor chip 200 may be disposed in the cavity 150c such that a first surface 200_1 on which the coupling pad 220 is disposed faces the upper surface of the first redistribution structure 100.

The connection structure 150 may include a wiring structure having first to third conduction pads 152a, 152b, and 152c (also referred to as wiring layers) and first and second connection vias 153a and 153b.

Figure 9:
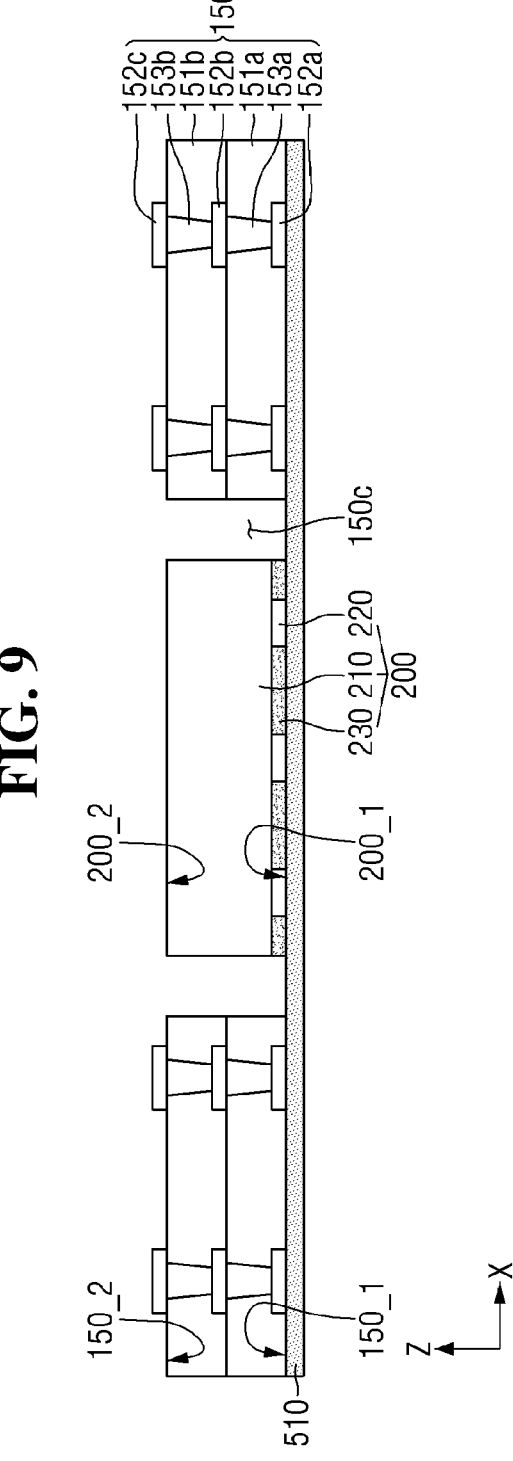

The connection structure 150 may include a first interlayer insulating layer 151a in contact with the upper surface of the first redistribution structure 100 and a first connection pad 152a in contact with the upper surface of the first redistribution structure 100 and embedded in the first interlayer insulating layer 151a, as also shown, for example, in FIG. 9.

The connection structure 150 may further include a second interlayer insulating layer 151b disposed on the first interlayer insulating layer 151a and a second connection pad 152b disposed on a side opposite to a side where the first connection pad 152a of the first interlayer insulating layer 151a is embedded.

The connection structure 150 may further include a first connection via 152a and a second connection via 153b. The first connection via 153a penetrates through the third connection pad 152c disposed on a side opposite to a side where the second connection pad 152b of the second interlayer insulating layer 151b is embedded and the first interlayer insulating layer 151a and electrically connects the first and second connection pads 152a and 152b. The second connection via 153b penetrates through the second interlayer insulating layer 151b and electrically connects the second and third connection pads 152b and 152c.

An insulating material may be used as a material of the first and second interlayer insulating layers 151a and 151b. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, ABF, FR-4 (Flame Retardant), Bismaleimide Triazine (BT), or the like.

The first to third connection pads 152a, 152b, and 152c may provide pad patterns for connection vias 153a and 153b to connect the upper and lower portions of the semiconductor package 1000. A material of each of the first to third connection pads 152a, 152b, and 152c may be a conductive material such as copper (Cu), aluminum (Al), silver (Ag), tin (Sn), gold (Au), nickel (Ni), lead (Pb), titanium (Ti), or alloys thereof. The first to third connection pads 152a, 152b, and 152c may perform various functions depending on designs of the corresponding layers.

For example, the first to third connection pads 152a, 152b, and 152c may include ground (GND) patterns, power (PWR) patterns, signal (S) patterns, and the like. Here, the signal (S) patterns may include various signals, such as data signals, and the like, except for the ground (GND) patterns, the power (PWR) patterns, and the like.

The first and second connection vias 153a and 153b may electrically connect the first to third connection pads 152a, 152b, and 152c formed on different layers to each other, resulting in an electrical path in the connection structure 150.

A material of each of the first and second connection vias 153a and 153b may be a conductive material. Each of the first and second connection vias 153a and 153b may be a field via completely filled with a conductive material, or a conformal via in which a conductive material is formed along a wall of each of via holes. Alternatively, each of first and second connection vias 153a and 153b may have a tapered shape. Meanwhile, each of the first and second connection vias 153a and 153b may be integrated with at least a portion of the first to third connection pads 152a, 152b, and 152c, but the present disclosure is not limited thereto.

In the drawings, the number of layers of the connection pad and the number of layers of the insulating layer of the connection structure 150 are 2 and 3, respectively, but the present disclosure is not limited thereto.

The first sealing layer 155 may be disposed between the first redistribution structure 100 and the second redistribution structure 300. The first sealing layer 155 may protect the first semiconductor chip 200 and the connection structure 150. The first sealing layer 155 may be disposed between the outside of the connection structure 150 and the first semiconductor chip 200 to fill the cavity 150c.

The first sealing layer 155 may cover the connection structure 150 disposed on the first redistribution structure 100. The first sealing layer 155 may cover at least a portion of the first semiconductor chip 200 disposed on the first redistribution structure 100. For example, the first sealing layer 155 may cover side surfaces of the first semiconductor chip 200. Also, for example, the first sealing layer 155 may cover the second surface 200_2 facing the first surface 200_1 of the first semiconductor chip 200.

The first sealing layer 155 may include an insulating material. For example, the first sealing layer 155 may include a photosensitive insulating material that can be used in a photoresist process. In this case, the first sealing layer 155 may include a photo-imageable encapsulant (PIE) in the form of a film. The first sealing layer 155 may not include a filler. When the first sealing layer 155 is a PIE in the form of a film, voids generated in the sealing layer may be reduced as compared to a sealing layer coated with liquid PID.

The first sealing layer 155 may include an upper surface and a lower surface that face each other. The lower surface of the first sealing layer 155 may be a surface which faces the first redistribution structure 100 and the upper surface of the first sealing layer 155 may be a surface which faces the second redistribution structure 300.

The second redistribution structure 300 may be disposed on the first sealing layer 155. The second redistribution structure 300 may redistribute the coupling pad 220 of the first semiconductor chip 200. The second redistribution structure 300 may be a back redistribution layer (BRDL). A plurality of coupling pads 220 of the first semiconductor chip 200 may be redistributed through the first redistribution structure 100 and the second redistribution structure 300. For example, the plurality of coupling pads 220 may be physically and/or electrically connected to the first connection terminal 140 and a second connection terminal 190 through the first redistribution structure 100 and the second redistribution structure 300.

The second redistribution structure 300 may include an insulating layer 310 and a redistribution layer 320. The insulating layer 310 may include first and second insulating layers 311 and 312, and the redistribution layer 320 may include a first redistribution via 321V, a first redistribution pad 321P, a second redistribution via 322V, and a second redistribution pad 322P.

The second redistribution structure 300 may be in contact with the first sealing layer 155. For example, the first redistribution via 321V of the second redistribution structure 300 may be in contact with each of an upper surface of the third connection pad 152c of the connection structure 150 and the upper surface of the first sealing layer 155, and the first insulating layer 311 of the second redistribution structure 300 may be in contact with the upper surface of the first sealing layer 155.

The first redistribution via 321V may penetrate through the first sealing layer 155 and be physically and electrically connected to the connection structure 150. A portion of the first redistribution via 321V may be disposed within the first sealing layer 155. The first redistribution pad 321P may be connected to the first redistribution via 321V and be formed on the first sealing layer 155. The first redistribution via 321V may electrically connect the connection structure 150 to the first redistribution pad 321P.

The second redistribution via 322V may penetrate through the first insulating layer 311 and be physically and electrically connected to the first redistribution pad 321P. A portion of the second redistribution via 322V may be disposed within the first insulating layer 311. The second redistribution pad 322P may be electrically connected to the second redistribution via 322V and be formed on the first insulating layer 311.

The second insulating layer 312 may be formed to cover a portion of the second redistribution pad 322P on the first insulating layer 311. The second insulating layer 312 may include an opening that exposes a portion of the second redistribution pad 322P. The second connection terminal 190 to be described below may be disposed in the opening.

Referring to FIG. 6, the second redistribution structure 300 may include the first redistribution via 321V in contact with the first sealing layer 155 and the second redistribution via 322V in contact with the first insulating layer 311. The second redistribution structure 300 may include a first via hole 321T passing through at least a portion of the first sealing layer 155 and a second via hole 322T passing through at least a portion of the first insulating layer 311.

The surface roughness of the contact surface CS1 between the first sealing layer 155 and a first seed layer 321a of the first redistribution via 321V may be less than or equal to the surface roughness of the contact surface CS2 between the first insulating layer 311 and the second redistribution via 322V. In this case, the surface roughness of a sidewall of the first via hole 321T may be less than or equal to the surface roughness of a sidewall of the second via hole 322T.

For example, when the first sealing layer 155 and the first insulating layer 311 both are formed of the same photosensitive insulating layers, the first sealing layer 155 and the first insulating layer 311 may include the same material. In various embodiments, the surface roughness of the contact surface CS1 between the first sealing layer 155 and the first redistribution via 321V may be equal to the surface roughness of the contact surface CS2 between the first insulating layer 311 and the second redistribution via 322V.

Alternatively, for example, when the first sealing layer 155 is formed of a photosensitive insulating layer and the first insulating layer 311 is formed of a non-photosensitive insulating layer or ABF, the first sealing layer 155 and the first insulating layer 311 may include different materials from each other. In this case, the surface roughness of the contact surface between the first sealing layer 155 and the first redistribution via 321V may be less than the surface roughness of the contact surface between the first insulating layer 311 and the second redistribution via 322V.

In this specification, surface roughness may refer to the degree of unevenness on a processed surface. A surface roughness may be measured using a shape of a cross section of a surface of a sample section. For example, the surface roughness may be measured by measuring a value of ten-point mean roughness (Rz) calculated by averaging distances to points farthest from a center line of a sample section.

As will be described below, the first via hole 321T may be formed using a photoresist process. In this case, a desmear process may not be performed on a sidewall of the first via hole 321T as compared to case where the first via hole 321T is formed using a laser, and thus the surface roughness of the sidewall of the first via hole 321T may be reduced.

In addition, since the first sealing layer 155 includes a photosensitive insulating material, the surface roughness of the sidewall of the first via hole 321T may be reduced as compared to a case where the second via hole 322T is formed in the first insulating layer 311 that does not include a photosensitive insulating material. Accordingly, in forming a via that connects the second redistribution structure to the first semiconductor chip 200 or the second redistribution structure 300 to the connection structure 150, it is possible to realize micropatterns with improved reliability.

The first redistribution via 321V may include first and second seed layers 321a and 321b and a conductive layer 321c. The first and second seed layers 321a and 321b can be sequentially formed conformally along the sidewall and a bottom surface of the first via hole 321T, and the second conductive layer 321c is formed on the second seed layer 321b to fill the first via hole 321T. In a non-limiting exemplary embodiment, a titanium first seed layer 321a and a copper second seed layer 321b are sequentially stacked along a sidewall and a bottom surface of the first via hole 321T and/or a second via hole 322T. A conductive layer 321c is formed on the copper seed layer to fill the first via hole 321T and/or a second via hole 322T. The surface roughness of the sidewall of the first via hole 321T can be less than surface roughness of a sidewall of the second via hole 322T.

The first and second seed layers 321a and 321b may include different materials from each other. For example, the first seed layer 321a may include titanium (Ti) and the second seed layer 321*b* may include copper (Cu). The conductive layer 321*c* may include copper (Cu).

However, the present disclosure is not limited thereto, and the first and second seed layers 321*a* and 321*b* and the conductive layer 321*c* may include at least one of copper (Cu), aluminum (Al), silver (Ag), tin (Sn), gold (Au), nickel (Ni), lead (Pb), titanium (Ti), or alloys thereof.

The first and second seed layers 321*a* and 321*b* may be formed by a sputtering process, and the conductive layer 321*c* may be formed using a plating process. In this case, the density of copper included in the second seed layer 321*b* and the density of copper included in the conductive layer 321*c* may be different from each other. Accordingly, an interface may be formed between the second seed layer 321*b* and the conductive layer 321*c*.

Figure 7:
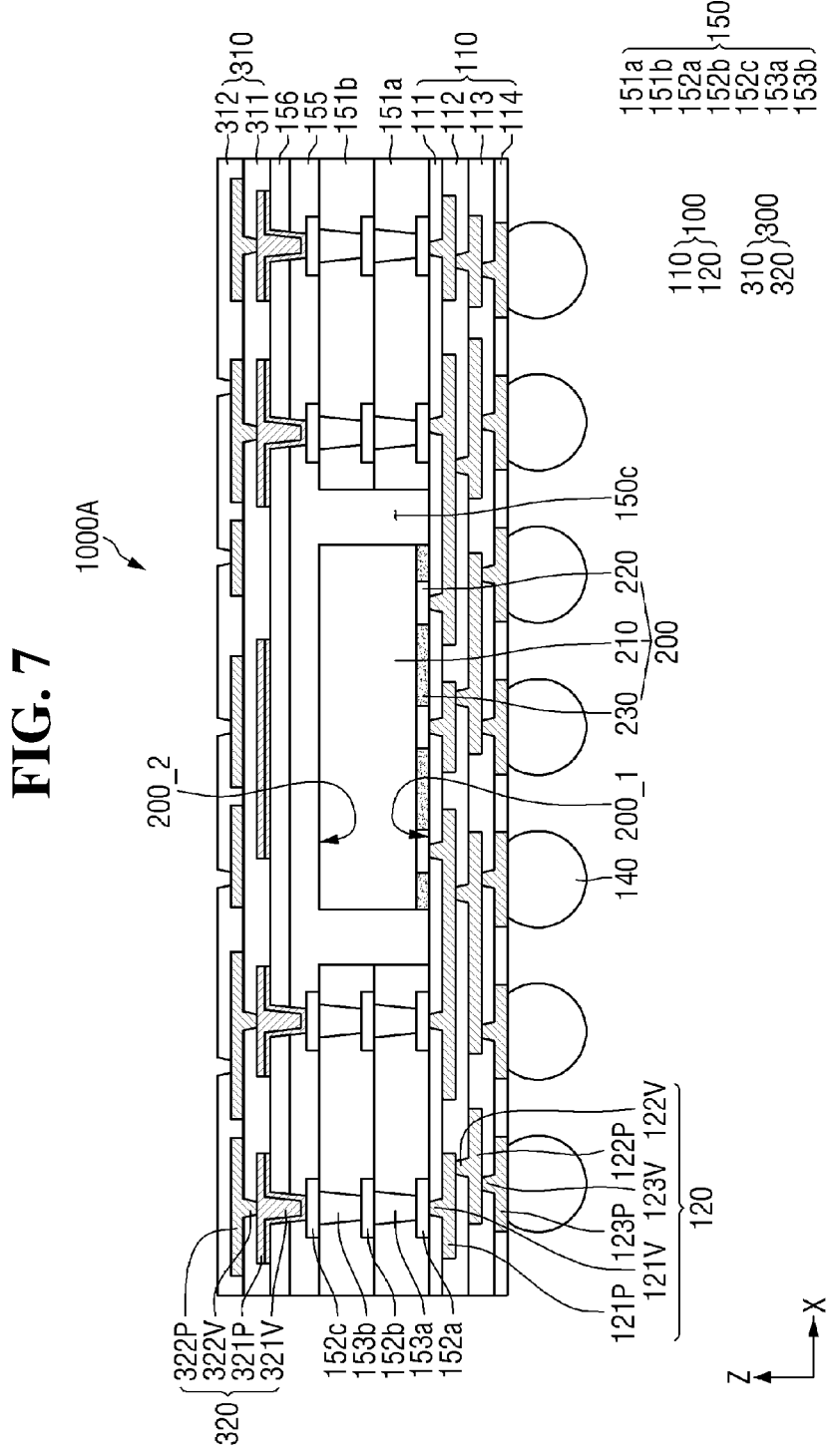
FIG. 7 is a cross-sectional side view of a semiconductor package, according to some embodiments of the present disclosure, according to embodiments of the present disclosure.

FIG. 7 is a cross-sectional view of a semiconductor package according to some embodiments of the present disclosure. For convenience of description, repeated contents of parts described with reference to FIGS. 1 to 6 may be briefly described or omitted.

Referring to FIG. 7, the sealing layer 155 may be provided in plural. For example, a semiconductor package 1000A may further include a second sealing layer 156 disposed on the first sealing layer 155.

The first and second sealing layers 155 and 156 may each include a photosensitive material layer in the form of a film.

The first redistribution via 321V may include a first region in contact with the first sealing layer 155 and a second region in contact with the second sealing layer 156. The surface roughness of the contact surface between the second sealing layer 156 and the second region may be less than or equal to the surface roughness of the contact surface between the first insulating layer 311 and the second redistribution via 322V.

Figure 8:
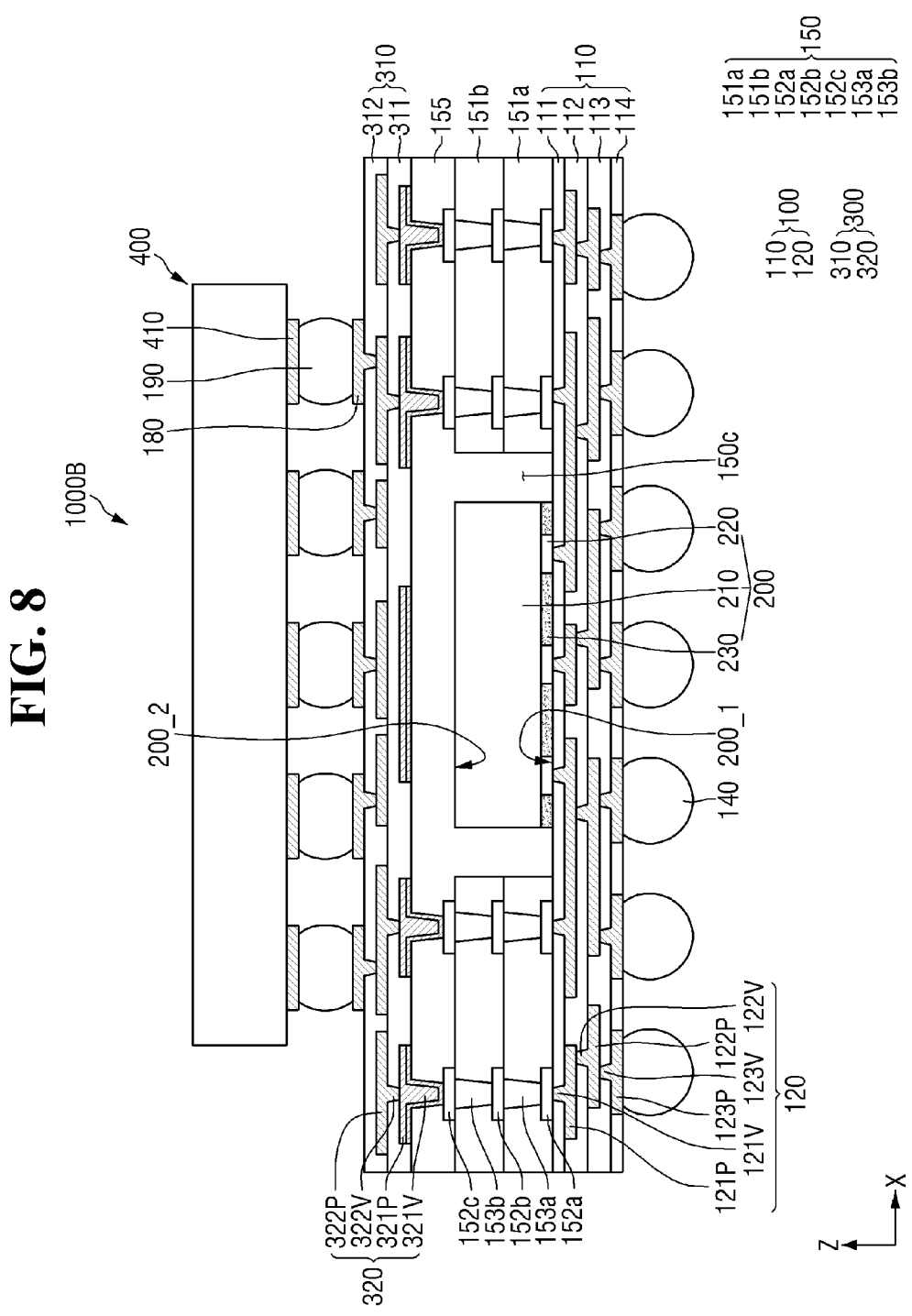
FIG. 8 is a cross-sectional side view of a semiconductor package, according to embodiments of the present disclosure.

FIG. 8 is a cross-sectional view of a semiconductor package according to some embodiments of the present disclosure. For convenience of description, repeated contents of parts described with reference to FIGS. 1 to 7 may be briefly described or omitted.

Referring to FIG. 8, a semiconductor package 1000B may further include an upper semiconductor package 400. For example, the upper semiconductor package 400 may be disposed on the second connection terminal 190. For example, the upper semiconductor package 400 may be disposed on the second redistribution structure 300.

The upper semiconductor package 400 may include a second semiconductor chip and a coupling pad 410. In various embodiments, the second semiconductor chip may be mounted in the upper semiconductor package 400. For example, the second semiconductor chip may include a volatile memory chip such as a DRAM or an SRAM, or a non-volatile memory chip such as a PRAM, an MRAM, a FeRAM, or an RRAM.

The second semiconductor chip may be electrically connected to the second connection terminal 190 through the coupling pad 410. The coupling pad 410 may be physically and electrically connected to the second connection terminal 190. The upper semiconductor package 400 may be electrically connected to the first semiconductor chip 200 via the second connection terminal 190, the second redistribution structure 300, and the first redistribution structure 100. The first semiconductor chip 200 and the second semiconductor chip may transmit and receive signals through the electrical path.

The semiconductor package 1000B may be a package on package (POP) in which the upper semiconductor package 400 is mounted on a lower semiconductor package. As the coupling pad 220 of the first semiconductor chip 200 is redistributed through the first redistribution structure 100 and the second redistribution structure 300 and is connected to the second semiconductor chip, the semiconductor package 1000B may have more semiconductor chips mounted in the same area.

FIGS. 9 to 18 are views illustrating intermediate stages of fabrication, provided to explain a method of fabricating a semiconductor package according to some embodiments of the present disclosure. For convenience of description, repeated contents of parts described with reference to FIGS. 1 to 7 may be briefly described or omitted.

Referring to FIG. 9, the first semiconductor chip 200 may be formed on an adhesive layer 510 such that the first surface 200_1 of the first semiconductor chip 200 faces the adhesive layer 510. The coupling pad 220 of the first semiconductor chip 200 may be in contact with an upper surface of the adhesive layer 510.

The connection structure 150 may be formed on the adhesive layer 510 such that a first surface 150_1 of the connection structure 150 faces the adhesive layer 510.

The connection structure 150 that includes first and second interlayer insulating layers 151*a* and 151*b* stacked in a third direction Z and first and second connection vias 152*a* and 153*b* formed respectively in the first and second interlayer insulating layers 151*a* and 151*b* may be formed on the adhesive layer 510.

The adhesive layer 510 may include tape or the like. For example, the adhesive layer 510 may include an ultraviolet curable adhesive tape whose adhesive force is weakened by ultraviolet rays, a thermal curable adhesive tape whose adhesive force is weakened by heat treatment, or the like. The adhesive layer 510 may extend on a plane in a first direction X and a second direction Y.

The connection structure 150 may be formed on the adhesive layer 510 and be spaced apart from the first semiconductor chip 200 in the first direction X. For example, a through hole-shaped cavity 150*c* may be formed between the connection structure 150 and the first semiconductor chip 200.

Figure 10:
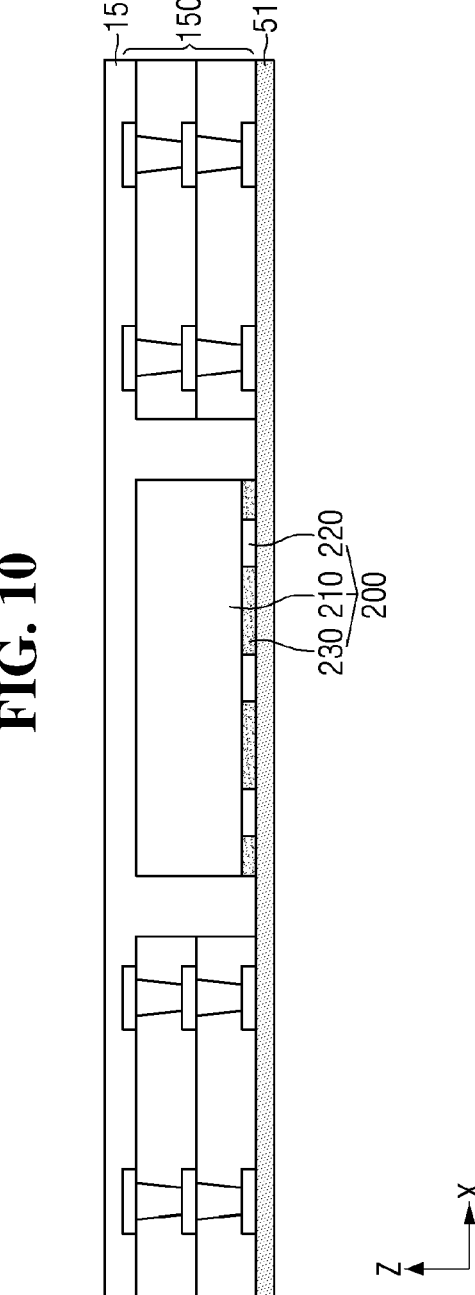

Referring to FIG. 10, the first sealing layer 155 is formed to cover the connection structure 150 and the first semiconductor chip 200. The first sealing layer 155 can cover the upper surface and side surfaces of the first semiconductor chip 200 to fill the cavity 150*c*.

Figure 11:
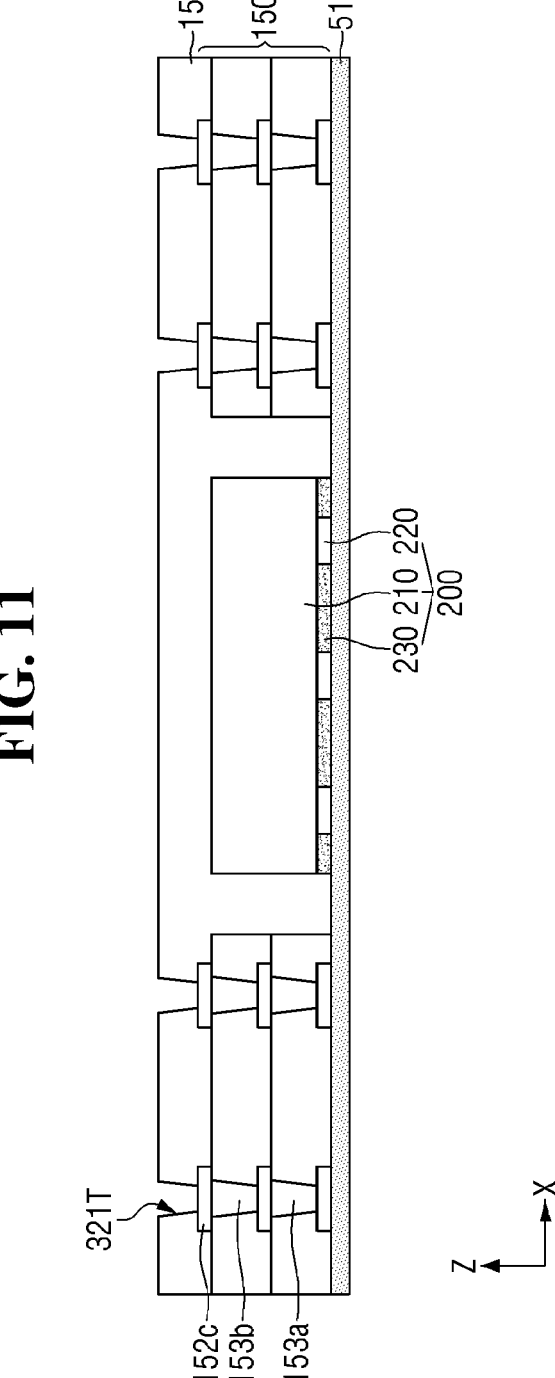

Referring to FIG. 11, an opening that exposes the third connection pad 152*c* of the connection structure 150 may be formed by removing at least a portion of the first sealing layer 155. The third connection pad 152*c* is exposed by forming a first via hole 321T in a partial region of the first sealing layer 155 that corresponds to the first and second connection vias 153*a* and 153*b*.

The first via hole 321T may have a tapered shape in which a width becomes narrower toward a lower portion, but is not limited thereto. The first via hole 321T may have a shape in which the upper and lower portions have the same width.

In various embodiments, the first via hole 321T passing through a portion of the first sealing layer may be formed by forming a mask on the first sealing layer 155 except for a region where the first via hole 321T is to be processed and performing exposure and development processes on the first sealing layer 155.

In various embodiments, the first via hole 321T may be formed by removing at least a portion of the first sealing layer 155 by means of a photoresist process. In this case, a desmear process may not be performed on a sidewall of the first via hole 321T as compared to case where the first via hole 321T is formed using laser, and thus the surface roughness of the sidewall of the first via hole 321T may be reduced.

Figure 12:
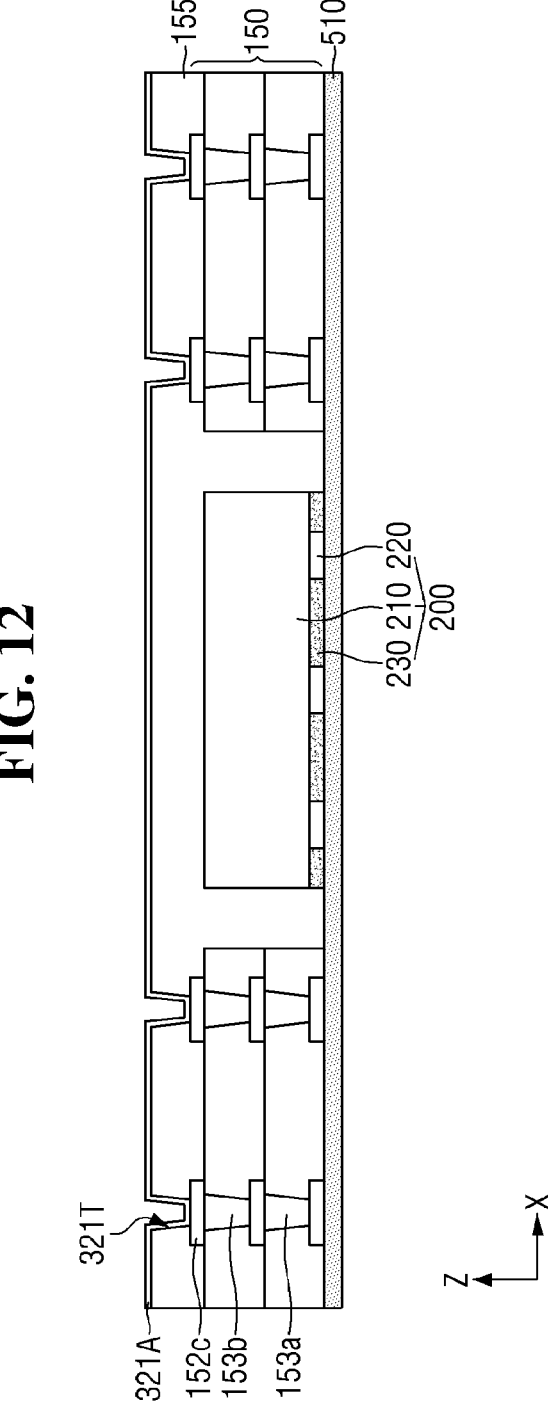

Referring to FIG. 12, a seed layer 321A may be conformally formed along the sidewall and the bottom surface of the first via hole 321T and the upper surface of the first sealing layer 155. In FIG. 12, the seed layer 321A is illustrated as one layer for convenience of illustration, but it may be understood that the seed layer 321A according to some embodiments may include the first and second seed layers 321a and 321b described above.

The seed layer 321A may be formed by a sputtering process. In this case, the seed layer 321A may be formed thinner than the case in which the seed layer 321A is formed by electroless plating.

Figure 13:
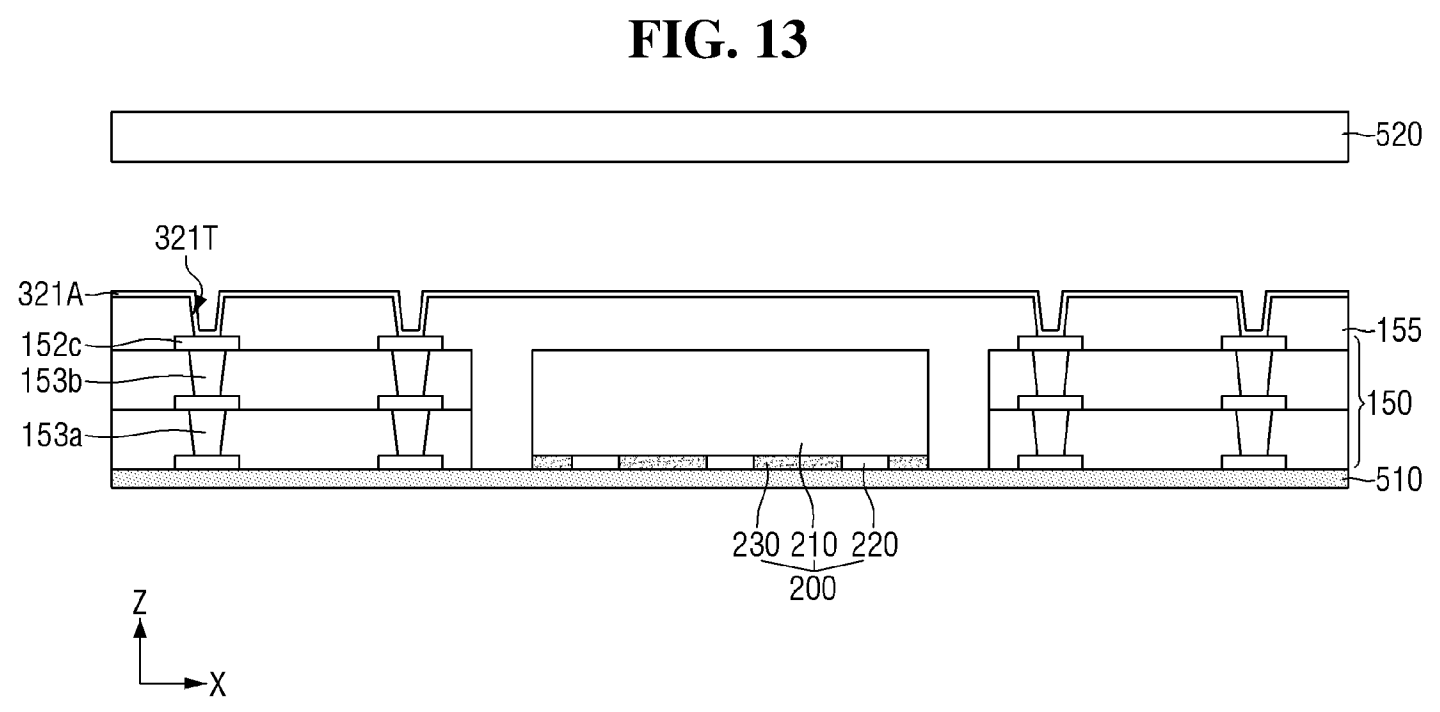

Referring to FIG. 13, a first carrier substrate 520 may be placed on the second surface 200_2 of the first semiconductor chip 200, and the first carrier substrate 520 may be attached to the seed layer 321A. The first carrier substrate 520 may include a CCL, prepreg, ABF, epoxy, polyimide, and the like.

Figure 14:
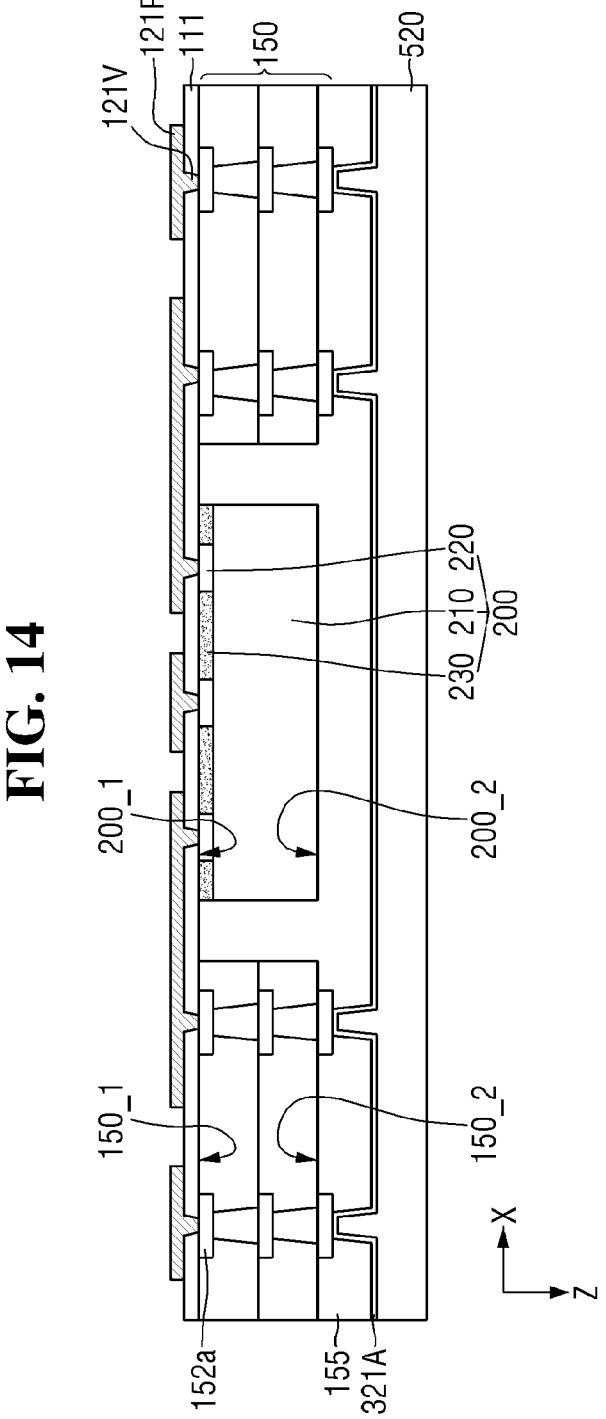

Referring to FIG. 14, the first redistribution structure 100 may be formed in a state in which the first carrier substrate 520 is attached to the seed layer 321A. The first redistribution structure 100 may be formed on the first surface 200_1 of the first semiconductor chip 200 and the first surface 150_1 of the connection structure 150.

In addition, the adhesive layer 510 on the first surface 200_1 of the first semiconductor chip 200 may be peeled off. For example, the adhesive layer 510 may be peeled off from the first semiconductor chip 200 and the connection structure 150.

In various embodiments, the first redistribute structure 100 may be formed on the first surface 200_1 of the first semiconductor chip 200 on which the coupling pad 220 is disposed.

In order to redistribute the coupling pads 220, the first insulating layer 111, the first redistribution via 121V, and the first redistribution pad 121P may be formed on the first surface 200_1 of the first semiconductor chip 200. In addition, the first insulating layer 111, the first redistribution via 121V, and the first redistribution pad 121P may be formed on the first connection pad 152a of the connection structure 150.

The first insulating layer 111 may be formed and an opening that exposes the coupling pad 220 and the first connection pad 142a may be formed. The first redistribution via 121V may be formed by filling the opening, and the first redistribution pad 121P may be formed on the first redistribution via 121V and the first insulating layer 111.

Figure 15:
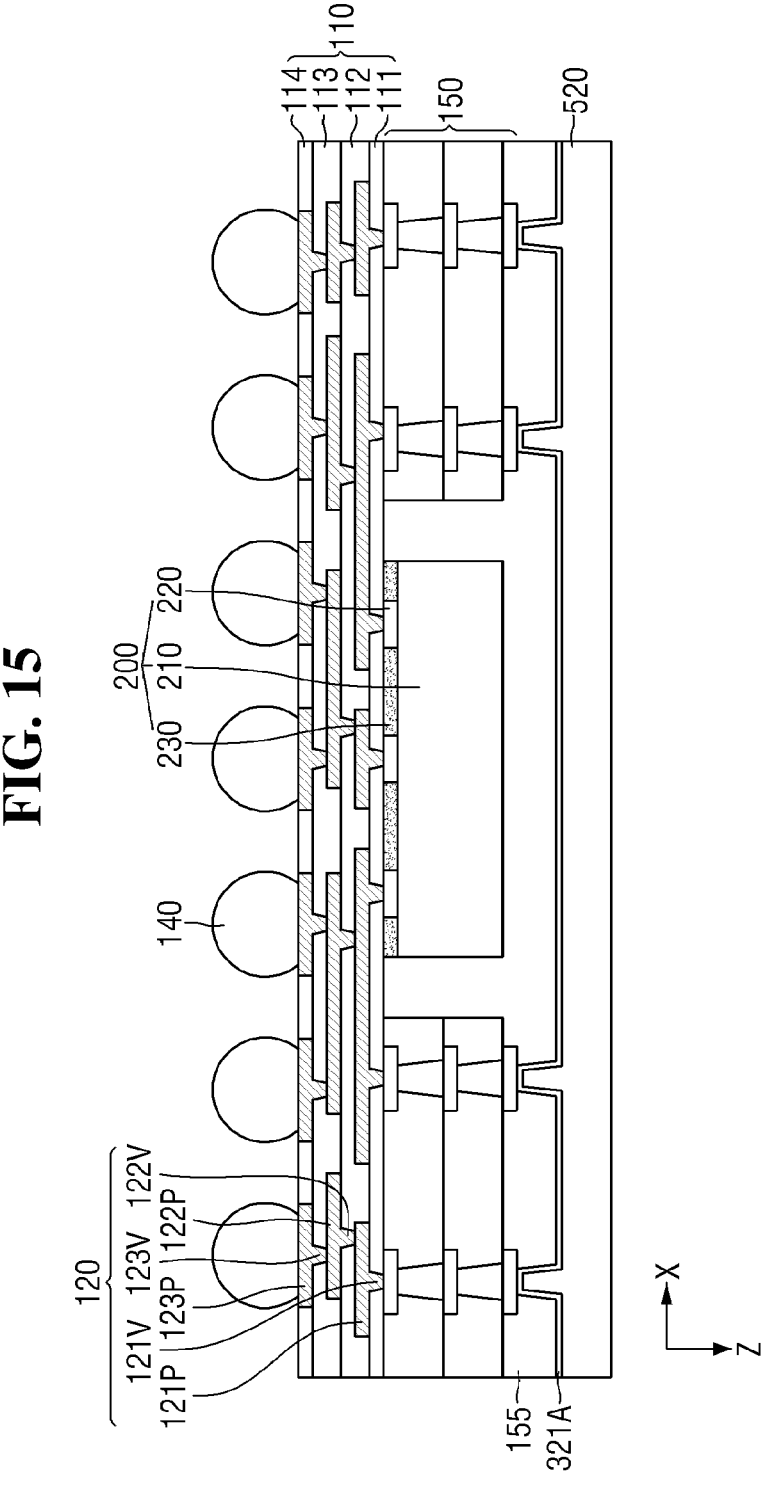

Referring to FIG. 15, the second and third insulating layers 112 and 113 may be formed on the first insulating layer 111, the second and third redistribution vias 122V and 123V may be formed on the first redistribution via 121V, and the second and third redistribution pads 112P and 123P may be formed on the first redistribution pad 121P. Accordingly, the first redistribution structure 100 may redistribute the coupling pad 220 and the connection structure 150.

The fourth insulating layer 114 may be formed on the first redistribution structure 100. The fourth insulating layer 114 may protect the first redistribution structure 100.

An opening may be formed in the fourth insulating layer 114 so that the third redistribution pad 123P may be opened. The first connection terminals 140 may be connected onto the opened third redistribution pad 123P and the fourth insulating layer 114. In this case, at least one of the first connection terminals 140 may be placed in a fan-out region.

Accordingly, the semiconductor package 1000 may be a fan-out semiconductor package.

Figure 16:
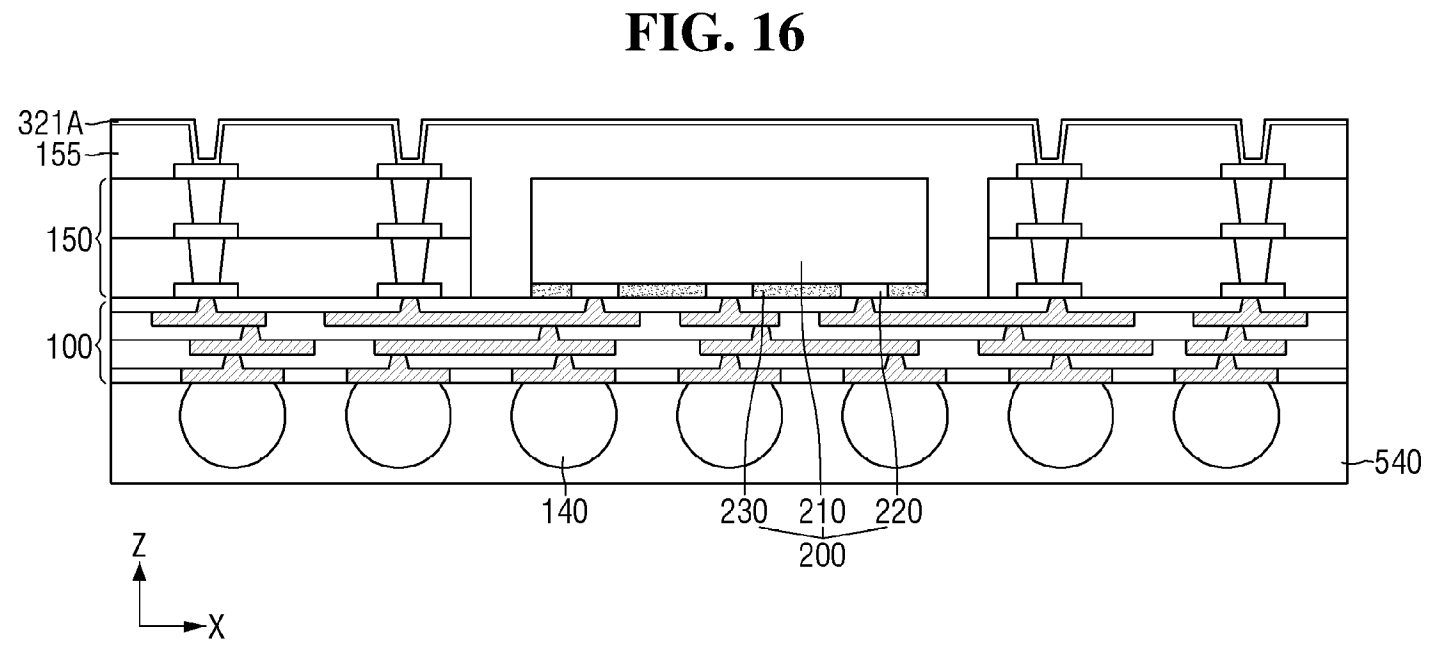

Referring to FIG. 16, a second carrier substrate 540 may be formed on the first redistribution structure 100 on which the first connection terminals 140 are formed. The second carrier substrate 540 may be formed on the first redistribution structure 100 to embed therein the first connection terminals 140.

In addition, the first carrier substrate 520 may be removed.

Figure 17:
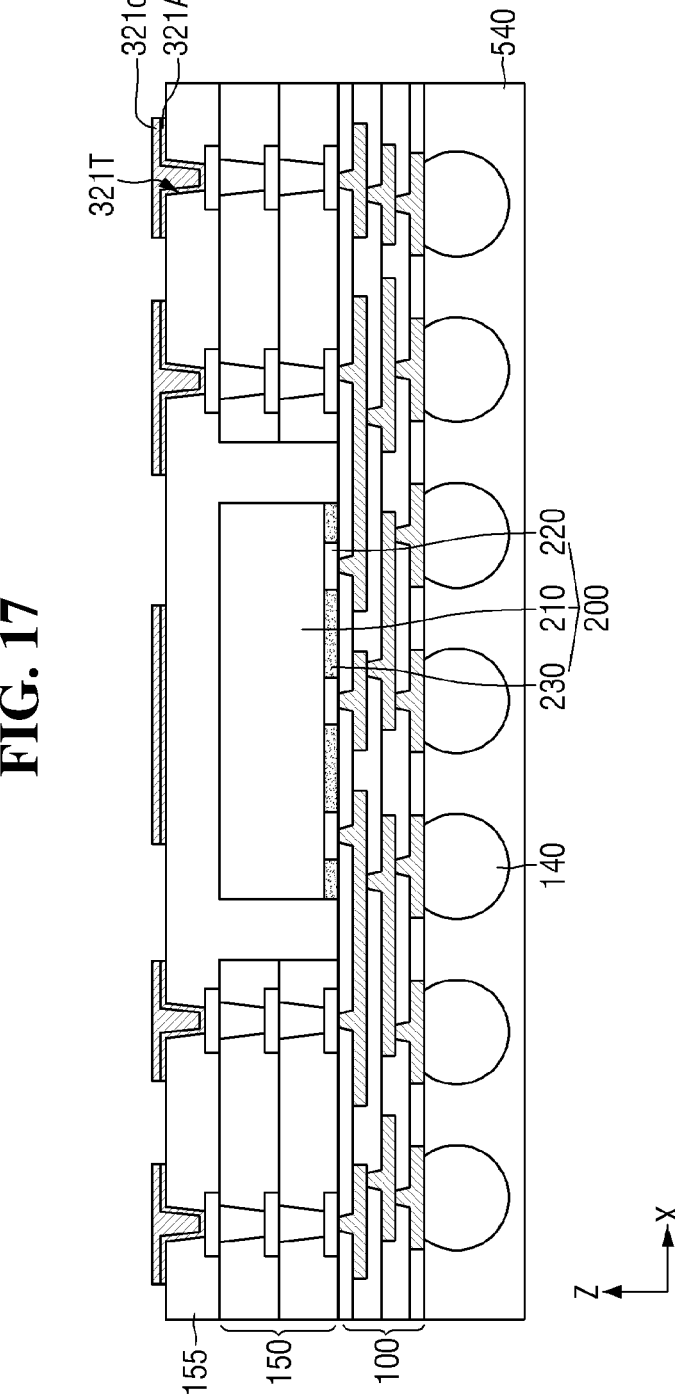

Referring to FIG. 17, the conductive layer 321c may be formed on the seed layer 321A. Thereafter, the upper surface of the first sealing layer 155 may be exposed by partially removing the seed layer 321A and the conductive layer 321c.

In various embodiments, the seed layer 321A and the conductive layer 321c may be partially removed by forming a mask on the first sealing layer 155 except for a region where the seed layer 321A and the conductive layer 321c are to be processed and performing exposure and development processes on the first sealing layer 155.

The conductive layer 321c may be formed to fill the first via hole 321T. For example, a portion of the seed layer 321A formed along the upper surface of the first sealing layer 155 can be removed, and the conductive layer 321c formed on the seed layer 321A to fill the first via hole 321T.

Figure 18:
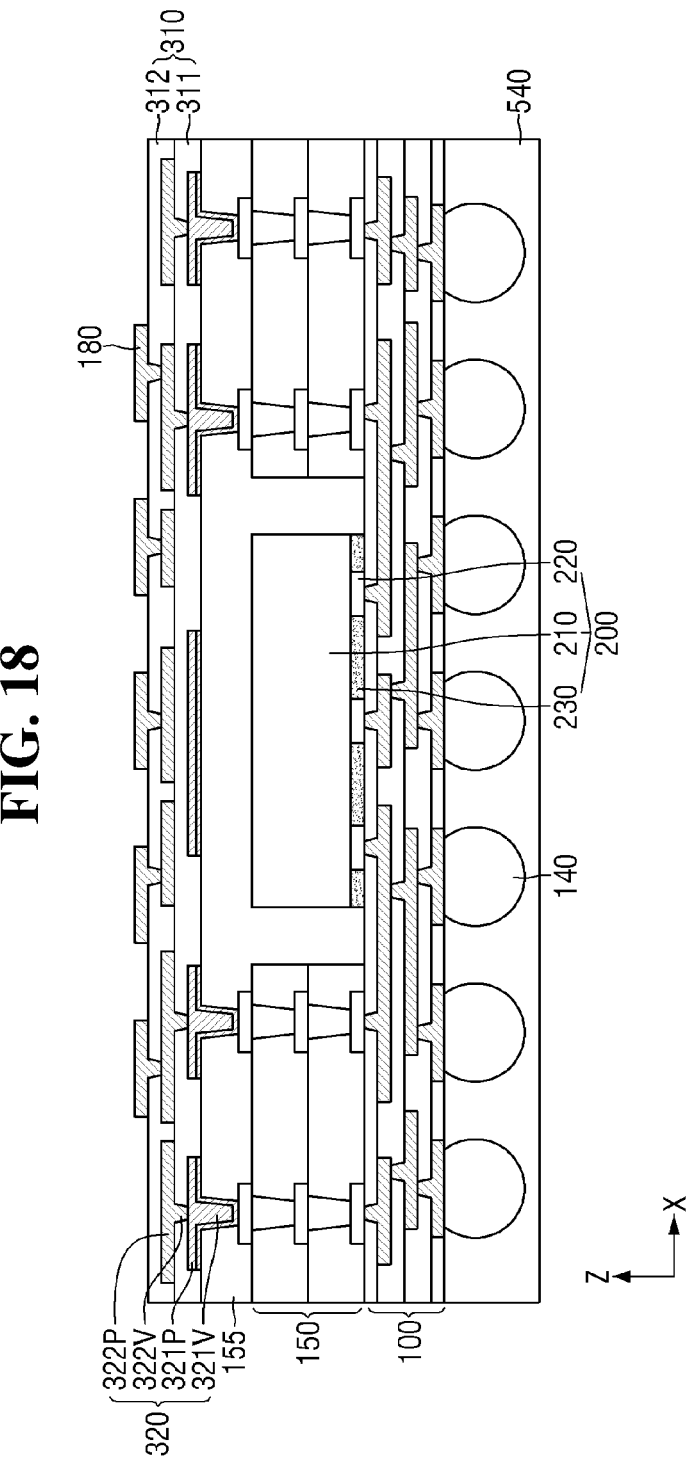

Referring to FIG. 18, the second redistribution via 322V may be formed on the first redistribution via 321V and the second redistribution pad 322P may be formed on the first redistribution pad 321P. Accordingly, the second redistribution structure 300 may redistribute the coupling pad 220 and the connection structure 150.

The second insulating layer 312 may be formed on the second redistribution structure 300. The second insulating layer 312 may protect the second redistribution structure 300.

An opening may be formed in the second insulating layer 312 so that the second redistribution pad 322P may be opened. An under bump metal layer 180 may be formed on the opened second redistribution pad 322P and the second insulating layer 312.

In addition, the second carrier substrate 540 may be peeled off. For example, the second carrier substrate 540 may be peeled off from the first redistribution structure 100.

Thereafter, referring to FIG. 8, the second connection terminal 190 may be connected to the under bump metal layer 180.

In addition, the upper semiconductor package 400 may be mounted onto the second connection terminal 190. For example, the coupling pad 410 of the upper semiconductor package 400 may be connected to the second connection terminal 190. The upper semiconductor package 400 may include a second semiconductor chip that is different from the first semiconductor chip 200. The first semiconductor chip 200 and the second semiconductor chip may be electrically connected to each other via the first redistribution structure 100, the connection structure 150, and the second redistribution structure 300.

Since the first sealing layer 155 includes a photosensitive insulating material, the surface roughness of the sidewall of the first via hole 321T may be reduced as compared to a case where the second vial hole 322T is formed in the first insulating layer 311 that does not include a photosensitive insulating material. Accordingly, in forming a via that connects the second redistribution structure to the first semiconductor chip 200 or the second redistribution structure 300 to the connection structure 150, it is possible to realize micropatterns with improved reliability.

While the present disclosure has been particularly shown and described with reference to embodiments thereof and using specific terms, these embodiments are provided so that this disclosure will fully convey the concept of the present disclosure, and not for purposes of limitation. Thus, it will be obvious to one of ordinary skill in the art that various changes and other equivalents may be made therein. Therefore, the scope of the present disclosure is defined not by the detailed description of the present disclosure but by the appended claims.

What is claimed:

1. A semiconductor package comprising:
a first redistribution structure;
a first semiconductor chip including a first surface and a second surface, the first surface being disposed to face the first redistribution structure;
a second redistribution structure disposed on the second surface of the first semiconductor chip and including an insulating layer and a redistribution layer;
a first sealing layer disposed between the first and the second redistribution structures and configured to cover the second surface of the first semiconductor chip; and
a connection structure configured to connect the first and the second redistribution structures,
wherein the redistribution layer includes a first via in contact with the first sealing layer and a second via on the first via and in contact with the insulating layer,
wherein the first via includes a first seed layer and a second seed layer, and a conductive layer on the second seed layer and in a first via hole, and
wherein the first sealing layer includes a photosensitive insulating material integrally covering the second surface of the first semiconductor chip and a sidewall of the first seed layer,
wherein the first via includes a first region in contact with the first sealing layer and a second region in contact with a second sealing layer, and surface roughness of a contact surface between the second sealing layer and the second region is less than or equal to surface roughness of a contact surface between the insulating layer and the second via.

2. The semiconductor package of claim 1, wherein the first and second seed layers include different metal materials from each other.

3. The semiconductor package of claim 2, wherein a density of a material included in the second seed layer and a density of a material included in the conductive layer are different from each other.

4. The semiconductor package of claim 2, wherein the first seed layer includes titanium (Ti) and the second seed layer includes copper (Cu).

5. The semiconductor package of claim 1, wherein the first sealing layer and the insulating layer include the same material.

6. The semiconductor package of claim 1, wherein the first sealing layer and the insulating layer include different materials from each other.

7. The semiconductor package of claim 1, wherein the second sealing layer disposed on the first sealing layer,
wherein each of the first and second sealing layers includes a photosensitive material layer in the form of a film.

8. The semiconductor package of claim 1, wherein the connection structure includes a plurality of insulating layers, a plurality of connection pads on the plurality of insulating layers, and a connection via between the plurality of connection pads and the first via is disposed between the second via and the connection via and configured to electrically connect the second redistribution structure to the connection structure.

9. The semiconductor package of claim 1, wherein the first sealing layer is further disposed between the first semiconductor chip and the connection structure.

10. The semiconductor package of claim 1, wherein a coupling pad is formed on the first surface of the first semiconductor chip and the coupling pad is electrically connected to the first redistribution structure.

11. A semiconductor package comprising:
a first redistribution structure;
a first semiconductor chip including a first surface and a second surface and electrically connected to the first redistribution structure through a coupling pad formed on the first surface;
a second redistribution structure disposed on the second surface of the first semiconductor chip and including an insulating layer and a redistribution layer;
a connection structure configured to electrically connect the first and second redistribution structures;
a photosensitive insulating layer disposed between the first and second redistribution structures that covers the second surface of the first semiconductor chip;
a sealing layer disposed on the photosensitive insulating layer, and
wherein the redistribution layer includes a first via hole passing through at least a portion of the photosensitive insulating layer and a second via hole passing through at least a portion of the insulating layer,
wherein the redistribution layer further includes a first via filling the first via hole,
wherein the redistribution layer further includes a second via filling the second via hole,
wherein the first via includes a first seed layer and a second seed layer along a sidewall and a bottom surface of the first via hole and a conductive layer on the second seed layer to fill the first via hole,
wherein the photosensitive insulating layer integrally covers the second surface of the first semiconductor chip and a sidewall of the first seed layer, wherein the sealing layer includes a photosensitive material layer, and
wherein the first via includes a first region in contact with the photosensitive insulating layer and a second region in contact with the sealing layer and surface roughness of a contact surface between the sealing layer and the second region is less than or equal to surface roughness of a contact surface between the insulating layer and the second via.

12. The semiconductor package of claim 11, wherein the first and second seed layers include different conductive materials from each other.

13. The semiconductor package of claim 11, wherein surface roughness of a contact surface between the photosensitive insulating layer and the first via is less than or equal to surface roughness of a contact surface between the insulating layer and the second via.

14. The semiconductor package of claim 11, wherein the first and second seed layers, have a density of a material included in the second seed layer and a density of a material included in the conductive layer that are different from each other.

15. The semiconductor package of claim 11, wherein the first seed layer includes titanium (Ti) and the second seed layer includes copper (Cu).

16. A semiconductor package comprising:

a first redistribution structure including a first insulating layer and a first redistribution layer;

a first semiconductor chip including a first surface and a second surface and electrically connected to the first redistribution structure through a coupling pad formed on the first surface;

a second redistribution structure disposed on the second surface of the first semiconductor chip and including a second insulating layer and a second redistribution layer;

a connection structure configured to electrically connect the first and second redistribution structures;

a photosensitive insulating layer disposed between the first and second redistribution structures to cover the second surface of the first semiconductor chip and including no inorganic filler; and a sealing layer disposed on the photosensitive insulating layer, wherein the second redistribution layer includes a first via that fills a first via hole passing through at least a portion of the photosensitive insulating layer and a second via that fills a second via hole passing through at least a portion of the second insulating layer, wherein the sealing layer includes a photosensitive material layer, and wherein the first via includes a first region in contact with the photosensitive insulating layer and a second region in contact with the sealing layer and surface roughness of a contact surface between the sealing layer and the second region is less than or equal to surface roughness of a contact surface between the second insulating layer and the second via, the first via includes a titanium seed layer and a copper seed layer, which are sequentially stacked along a sidewall and a bottom surface of the first via hole, and a conductive layer formed on the copper seed layer to fill the first via hole, and surface roughness of the sidewall of the first via hole is less than surface roughness of a sidewall of the second via hole.

17. The semiconductor package of claim 16, wherein the photosensitive insulating layer and the second insulating layer include different materials from each other.

18. The semiconductor package of claim 16, wherein the photosensitive insulating layer is stacked in the form of a film and filled between the first semiconductor chip and the connection structure.

19. The semiconductor package of claim 16, wherein the titanium seed layer and the copper seed layer are formed by a sputtering process and a density of a material included in the copper seed layer and a density of a material included in the conductive layer are different from each other.

\* \* \* \* \*